(12) United States Patent
Kimura et al.

(10) Patent No.: US 6,768,357 B1
(45) Date of Patent: Jul. 27, 2004

(54) PLL CIRCUIT WHICH COMPENSATES FOR STOPPAGE OF PLL OPERATIONS

(75) Inventors: Takushi Kimura, Kawasaki (JP); Masamichi Nakajima, Kawasaki (JP)

(73) Assignee: Fujitsu General Ltd., Kawasaki (JP)

( * ) Notice: Subject to any disclaimer, the term of this patent is extended or adjusted under 35 U.S.C. 154(b) by 241 days.

(21) Appl. No.: 09/806,054

(22) PCT Filed: Aug. 23, 2000

(86) PCT No.: PCT/JP00/05629

§ 371 (c)(1), (2), (4) Date: Jul. 23, 2001

(87) PCT Pub. No.: WO01/22593

PCT Pub. Date: Mar. 29, 2001

(30) Foreign Application Priority Data

Sep. 21, 1999 (JP) .......... 11-267168

(51) Int. Cl.[7] .............................. H03L 7/00
(52) U.S. Cl. .......... 327/156; 327/159; 331/25; 331/DIG. 2
(58) Field of Search ............... 327/156, 159; 331/11, 14, 17, 18, 25, DIG. 2

(56) References Cited

U.S. PATENT DOCUMENTS

| 4,037,165 | A | * | 7/1977 | Ogita ................. 331/23 |
| 4,461,990 | A | * | 7/1984 | Bloomer ............. 323/235 |
| 4,769,704 | A | * | 9/1988 | Hirai et al. .......... 348/516 |
| 5,105,273 | A | * | 4/1992 | Hyakutake .......... 348/726 |
| 5,589,801 | A | * | 12/1996 | Yamamura et al. ..... 331/14 |
| 5,598,396 | A | * | 1/1997 | Horibe et al. ....... 369/47.25 |
| 5,982,239 | A | * | 11/1999 | Takahashi et al. ..... 331/11 |

FOREIGN PATENT DOCUMENTS

| JP | 6-338786 | 12/1994 |
| JP | 06338786 | 12/1994 |
| JP | 0107627 | 4/1998 |
| JP | 10-107627 | 4/1998 |
| JP | 11122102 | 4/1999 |

* cited by examiner

Primary Examiner—Timothy P. Callahan
Assistant Examiner—An T. Luu
(74) Attorney, Agent, or Firm—Armstrong, Kratz, Quintos, Hanson & Brooks, LLP

(57) ABSTRACT

When a voltage oscillator oscillates abnormally and a PLL circuit stops operating, in order to return to normal operation quickly, presence/absence of a comparison signal (fc) outputted from a frequency divider (4) is detected, and at times when there is no comparison signal (fc), an output signal of a phase comparator (4) is forcibly controlled to a low level temporarily, and an oscillation frequency of a voltage control oscillator (3) is decreased. The present invention is suitable for generation of a sampling clock of a wide range which is used when digitally processing analog image signals, and for the like

5 Claims, 4 Drawing Sheets

PLL CIRCUIT WHICH COMPENSATES FOR STOPPAGE OF PLL OPERATIONS

TECHNICAL FIELD

The present invention relates to a PLL circuit which generates and outputs a frequency signal which has a predetermined relationship with a reference frequency signal, and in particular, to a PLL circuit which enacts countermeasures in cases in which PLL operation stops.

BACKGROUND TECHNOLOGY

As illustrated in FIG. 7, in a PLL circuit, phases of a reference signal fr and a comparison signal fc are compared at a phase comparator 101 which is formed by an exclusive OR circuit or the like. The signal of the results of comparison is smoothed at a loop filter 102 to become a control voltage Vc. The frequency oscillated by a voltage control oscillator (VCO) 103 is controlled by this control voltage Vc, and the frequency signal fck obtained thereat is the output frequency signal. This output frequency signal fck is inputted to a frequency divider 104, and there, the frequency is made to be 1/N and the resulting signal is inputted as the comparison signal fc to the phase comparator 101.

At the PLL circuit, the entire circuit is operated such that, given that the frequency of the reference signal fr is fr, the frequency of the comparison signal fc is fc, and the frequency of the oscillation frequency signal fck is fck, in a synchronized state, the relational formulas $$fr \cong fc, \ fc=fck/N$$

are satisfied, such that the comparison signal fc always follows the reference signal fr.

When an analog image signal is digitally processed, a PLL circuit such as that described above is used in order to generate a sampling clock. The frequency of the sampling clock extends over a wide range of from 10 MHz to 100 MHz or more depending on the type of image signal.

Therefore, there are cases in which it is demanded of the voltage control oscillator 103 that the maximum/minimum frequency ratio of the oscillation frequency thereof is two times or more, and that the oscillation frequency is greater frequency range that can cover such cases is used.

However, in a PLL circuit having a voltage control oscillator of such a wide frequency range, when the oscillation frequency is higher than needed, the circuit of a portion which forms the PLL circuit may not able to follow, and PLL operation may stop. Such a situation occurs, for example, when the reference signal fr changes suddenly (the input signal becomes on/off, or the like) and the oscillation frequency varies greatly until a synchronized stable state is reached, or when the frequency of the reference signal fr is increased greatly and the oscillation frequency is increased, and the like.

In such cases, the frequency dividing operation of the frequency dividing circuit 104 is not able to follow, and the output signal, i.e., the comparison signal fc, disappears. Thus, the phase comparator 101 judges that the oscillation frequency of the voltage control oscillator 103 has fallen, operates such that the oscillation frequency is increased, and boosts the control voltage Vc to the maximum oscillation frequency. When such a state arises, even if this state is temporary, it is impossible for operation to return to normal by itself.

Therefore, conventionally, in order to have the oscillation frequency fck of the voltage control oscillator 103 not exceed the operating limit frequencies of the other circuits forming the PLL circuit, a voltage limiting circuit 105 such as that illustrated in FIG. 8 was inserted between the voltage control oscillator 103 and the loop filter 102, so as to provide an upper limit for the control voltage Vc.

In the voltage limiting circuit 105 of FIG. 8, the maximum value of the control voltage Vc is limited by a voltage-regulator diode ZD, and, as illustrated in FIG. 9, the oscillation frequency of the voltage control oscillator 103 is limited to fd which is sufficiently lower than the maximum value fmax. As a result, the frequency fck, which oscillates at the voltage control oscillator 103, is in the range from the minimum frequency fmin to the upper limit frequency fd, and the above-described problem can be avoided.

However, in a method in which the control voltage Vc inputted to the voltage control oscillator 103 is directly limited by the voltage limiting circuit 105 in this way, there were the problems that the dispersion in the characteristics of the voltage-regulator diode ZD which is the limiting element of the voltage limiting circuit 105, and the dispersion in the oscillation frequency fck at the voltage control oscillator 103 with respect to the control voltage Vc, had to be newly corrected, and further, that the oscillation frequency of the PLL circuit had to be limited with sufficient margin from the operation frequency (target frequency) of the PLL circuit.

Therefore, an object of the present invention is to provide a PLL circuit which can easily return to normal, even if the voltage control oscillator oscillates abnormally and PLL operation stops.

DISCLOSURE OF THE INVENTION

In the present invention, a PLL circuit in which a phase comparator, a loop filter, a voltage control oscillator and a frequency divider are successively loop-connected, comprises: operation stoppage detecting means for detecting that PLL operation has stopped; and control means for, when said operation stoppage detecting means detects stoppage of operation, controlling the voltage control oscillator such that an oscillation frequency of the voltage control oscillator is low. In this way, when the oscillation frequency of the voltage control oscillator exceeds a predetermined value and the PLL circuit stops operating, operation can quickly be returned to normal by a simple structure.

PREFERRED EMBODIMENT FOR IMPLEMENTING THE INVENTION

Figure 1:
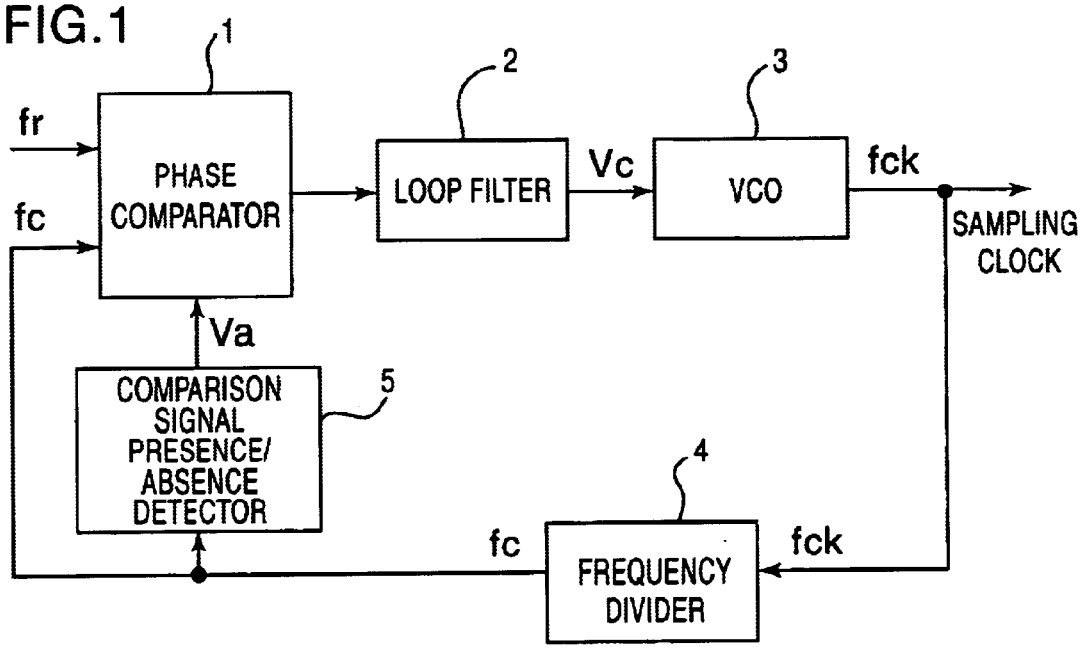
FIG. 1 is a block diagram of a PLL circuit of a first embodiment of the present invention.

FIG. 1 is a block diagram of a PLL circuit of an embodiment of the present invention. 1 is a phase comparator which compares phases of a reference signal fr and a comparison signal fc and outputs a signal which corresponds to the results of the comparison, 2 is a loop filter which smoothes the comparison signal, 3 is a voltage control oscillator which oscillates a signal fck of a frequency which is proportional to an inputted control voltage Vc, 4 is a frequency divider which frequency-divides the frequency of an inputted signal into 1/N, and 5 is a comparison signal presence/absence detector (operation stoppage detecting means) which detects the presence/absence of the comparison signal fc.

In this way, in the present embodiment, the comparison signal presence/absence detector 5 is connected to the output side of the frequency divider 4. When it is detected there that there is no comparison signal fc, the signal outputted from the phase comparator 1 is a signal which controls the oscillation frequency fck of the voltage control oscillator 3 to a low frequency.

Figure 2:
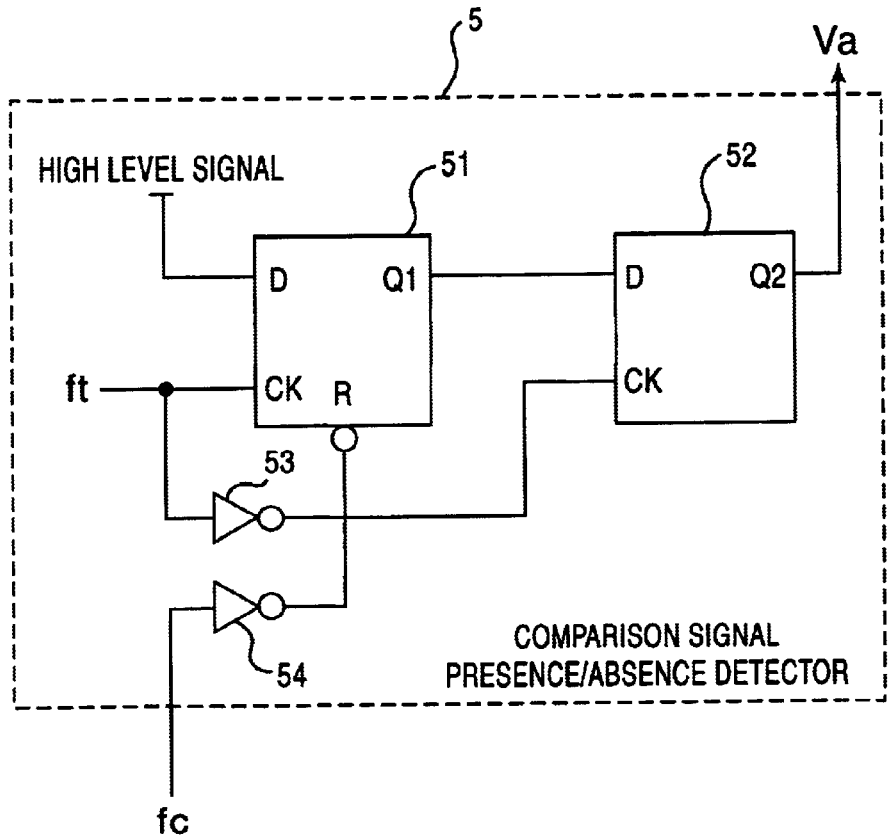
FIG. 2 is a block diagram of a comparison signal presence/absence detector.

FIG. 2 is a block diagram which illustrates the internal structure of the comparison signal presence/absence detector 5. 51, 52 are DFF circuits, and 53, 54 are inverters. Here, a high level signal is inputted to the D terminal of the DFF circuit 51, and a test signal ft generated independently (and having a frequency less than or equal to ½ of the comparison signal fc and a duty ratio of 50%) is inputted to the CK terminal of the DFF circuit 51. The comparison signal fc is inputted to the R (reset) terminal of the DFF circuit 51 via the inverter 54. Further, in the DFF circuit 52, a signal from the Q1 terminal of the DFF circuit 51 is inputted to the D terminal of the DFF circuit 52, and the test signal ft is inverted at the inverter 53 and inputted to the CK terminal of the DFF circuit 52.

Figure 3:
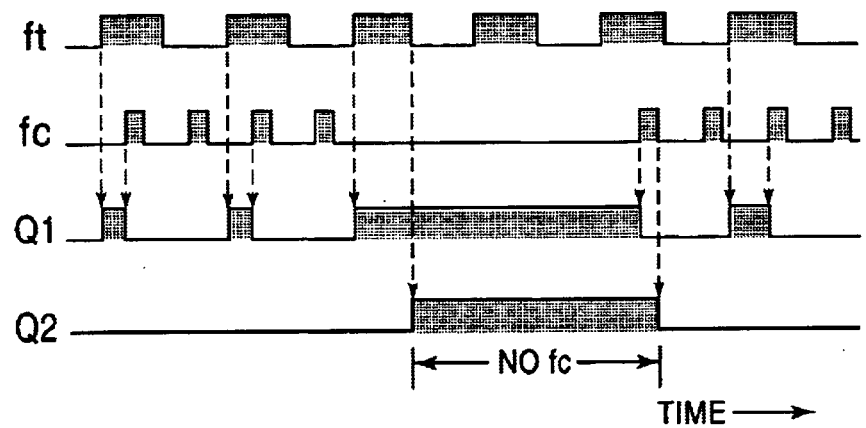
FIG. 3 is a timing chart of operation of the comparison signal presence/absence detector.

FIG. 3 is a timing chart of operation of the comparison signal presence/absence detector 5. Each time the test signal ft rises, the Q1 terminal of the DFF circuit 51 senses a high level of the D terminal and becomes a high level. When the comparison signal fc rises, the Q1 terminal of the DFF circuit 51 is reset and becomes a low level. The DFF circuit 52 outputs, to the Q2 terminal, data of the D terminal at the time the electric potential of the CK terminal rises.

Therefore, when the comparison signal fc changes from H→L→H→ . . . at a predetermined period, even if the Q1 terminal of the DFF circuit 51 becomes a high level at the rise of the test signal ft, thereafter, the Q1 terminal of the DFF circuit 51 is reset at the rise of the comparison signal fc. Thus, thereafter, even if the test signal ft falls, the Q2 terminal of the DFF circuit 52 does not become a high level.

However, when there is no comparison signal fc, in other words, when the comparison signal fc does not change to a high level, the DFF circuit 51 is not reset. When the test signal ft falls, the DFF circuit 52 senses the high level signal of the Q1 terminal and outputs it as a high level signal to the Q2 terminal, and thereafter continues this operation. Note that, thereafter, when the comparison signal fc starts to change again, the Q2 terminal of the DFF circuit 52 returns to a low level.

Figure 4:
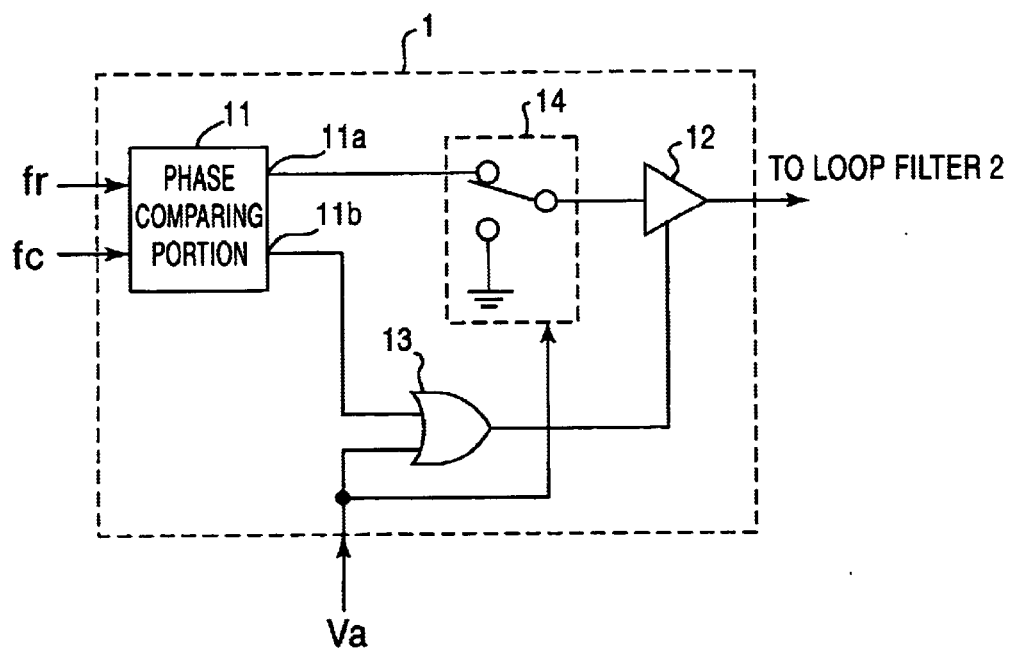
FIG. 4 is a block diagram of a phase comparator.

FIG. 4 is a block diagram which illustrates the internal structure of the phase comparator 1 which is controlled by the signal detected at the comparison signal presence/absence detector 5. 11 is a phase comparing portion which is formed by an exclusive OR gate or the like, 12 is a three state buffer, 13 is an OR gate, and 14 is a switch circuit. The three state buffer 12, the OR gate 13 and the switch circuit 14 form a control means. When the phase of the comparison signal fc is ahead of that of the reference signal fr, the phase comparing portion 11 makes an output terminal 11a a low level. Conversely, when the phase of the comparison signal fc is later than that of the reference signal fr, the phase comparing portion 11 makes the output terminal 11a a high level. The level is indefinite at times other than the times of phase comparison. Moreover, when there is a phase difference between the comparison signal fc and the reference signal fr, a control terminal 11b of the phase comparing portion 11 is a high level, and at other times, is a low level.

Here, the OR gate 13 takes the logical sum of a control signal outputted from the control terminal 11b of the phase comparing portion 11 and a detection signal Va detected at the comparison signal presence/absence detector 5, and sends the logical sum to the control terminal of the buffer 12. Further, a signal of the output terminal 11a of the phase comparing portion 11 is inputted to the input side of the buffer 12 via the switch circuit 14. Moreover, the switch circuit 14 switches to the ground side (low level) when the detection signal Va becomes a high level.

Therefore, when the detection signal Va of the comparison signal presence/absence detector 5 is a signal-exists signal, in other words, when the detection signal Va is low level, the buffer 12 is controlled according to the signal of the control terminal 11b of the phase comparing portion 11. Namely, during the time in which there is a phase offset between the comparison signal fc and the reference signal fr, the control terminal 11b is high level. Therefore, the buffer 12 is ON such that a signal can pass between the input and the output, and the signal of the output terminal 11a of the phase comparing portion 11 is outputted as it is via the switch circuit 14, and normal operation is carried out. When there is no phase offset (at times of PLL lock), the signal of the control terminal 11b is at a low level, and the output of the buffer 12 is high impedance. Due to the signal held at the loop filter 2 which is downstream of the phase comparator 1, thereafter, the voltage control oscillator 3 oscillates a constant frequency signal.

On the other hand, when the detection signal Va of the comparison signal presence/absence detector 5 is a signal-does-not-exist signal, in other words, when the detection signal Va is high level, the output of the switch circuit 14 is low level, and the buffer 12 turns ON such that a signal can pass between the input and the output. Therefore, the low level signal outputted from the switch circuit 14 is outputted as it is. Accordingly, the low level signal is inputted to the loop filter 2, and the control voltage Vc which is inputted to the voltage control oscillator 4 is low level, and the frequency oscillated thereat is low.

Figure 5:
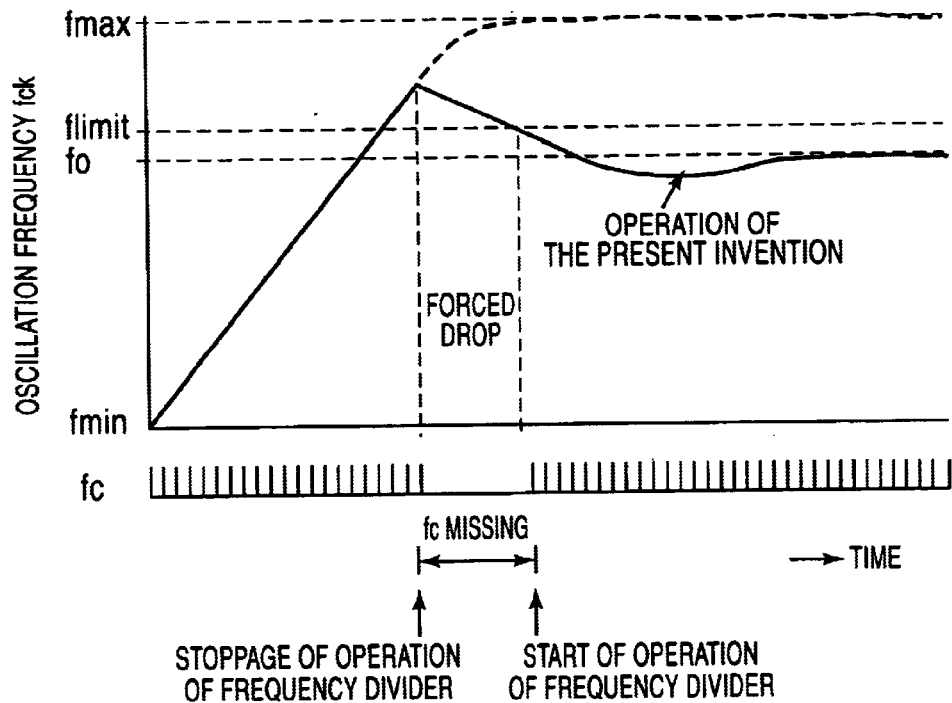
FIG. 5 is an operation characteristic diagram of forced return of a voltage control oscillator at the time of abnormal oscillation.

FIG. 5 is a diagram which illustrates an operation characteristic of the voltage control oscillator 3. fo is a target frequency of the frequency signal fck, fmax is an oscillation upper limit frequency, fmin is a oscillation lower limit frequency, and flimit is an input frequency which is an operating limit of the frequency divider 4. When the oscillation frequency fck is greater than the operating limit frequency flimit, the comparison signal fc disappears. Thus, as described above, the output signal of the phase comparator 1 is controlled to a low level, and the oscillation frequency of the voltage control oscillator 3 is controlled to a low frequency. In this way, when the oscillation frequency fck decreases and becomes less than the operating limit frequency flimit, the frequency divider 4 starts to operate again, and the PLL circuit returns to original operation, and the oscillation frequency fck settles to the target frequency fo.

In this way, in the present embodiment, even if the voltage control oscillator 3 oscillates abnormally and operation of the frequency divider 4 stops, this is sensed, and the voltage control oscillator 3 is controlled in the direction in which its oscillation frequency falls. Therefore, operation immediately returns to normal.

Figure 6:
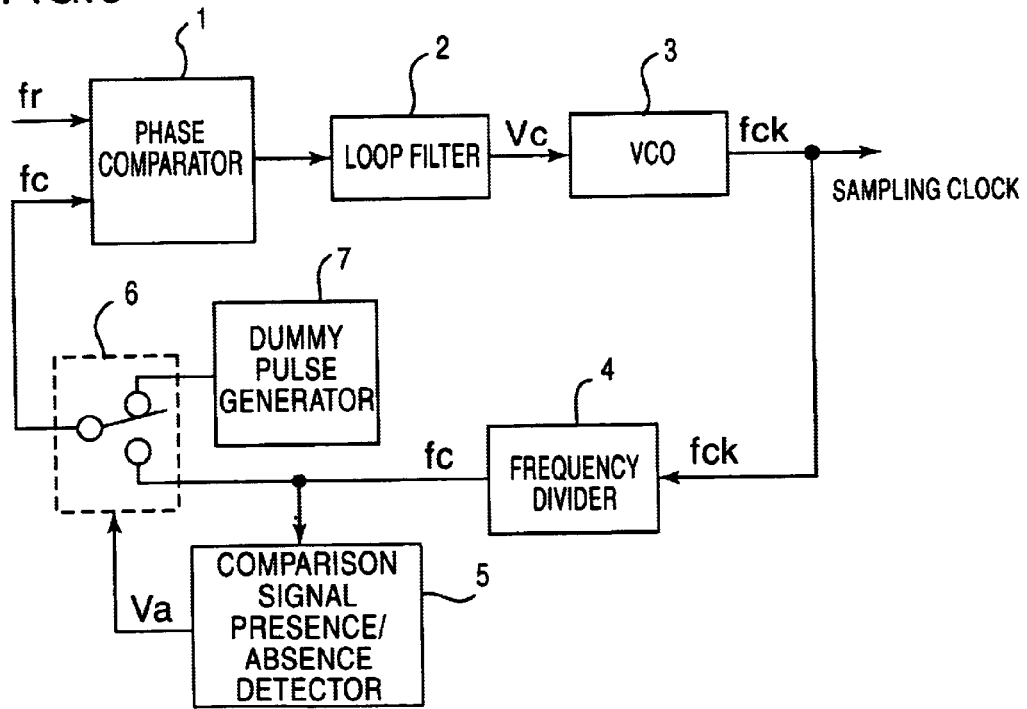
FIG. 6 is a block diagram of a PLL circuit of a second embodiment of the present invention.
Figure 7:
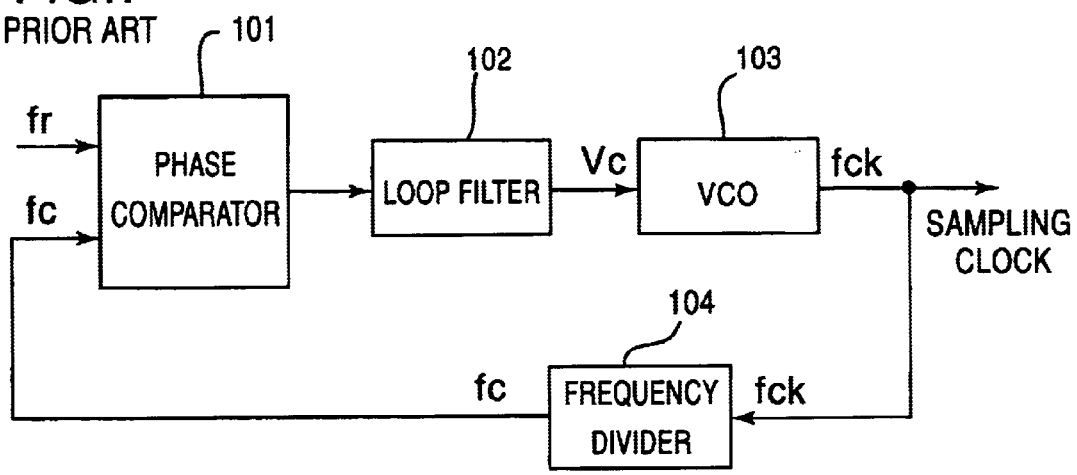
FIG. 7 is a block diagram of a conventional, general PLL circuit.
Figure 8:
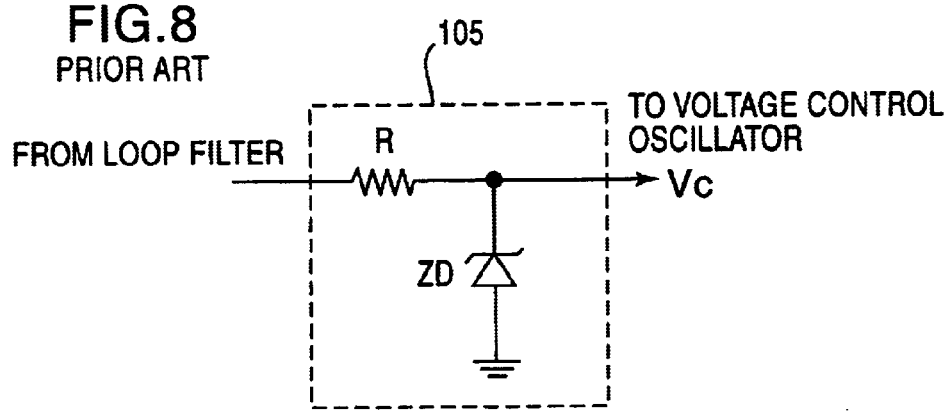
FIG. 8 is a circuit diagram of a voltage limiting circuit.
Figure 9:
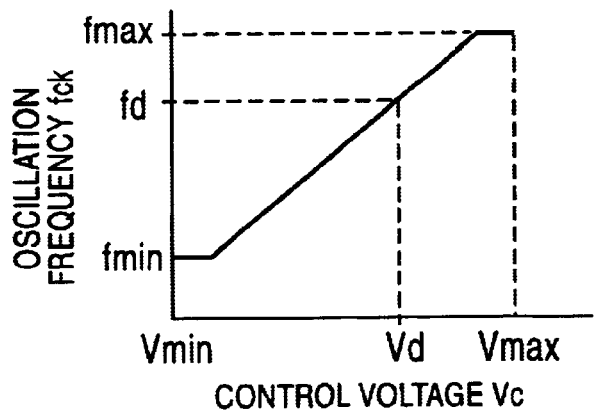
FIG. 9 is a characteristic diagram of oscillation frequency with respect to control voltage of the voltage control oscillator.

FIG. 6 is a block diagram which illustrates the structure of a PLL circuit of another embodiment. Here, a switch circuit 6 is connected between the frequency divider 4 and the phase comparator 1. At normal times, the switch circuit 6 is controlled such that the frequency divider 4 and the phase comparator 1 are connected to each other by the switch circuit 6. When it is detected at the comparison signal presence/absence detector 5 that there is no comparison signal, the switch circuit 6 is controlled so that a dummy pulse is inputted from a dummy pulse generator 7 as the comparison signal fc which is inputted to the phase comparator 1. The switch circuit 6 and the dummy pulse generator 7 form the control means.

At times of normal operation, the dummy pulse maybe a signal which is a higher frequency than a frequency of the frequency signal outputted from the frequency divider 4. In this way, in the present embodiment as well, when the voltage control oscillator 3 oscillates abnormally and the operation of the frequency divider 4 stops, operation can be returned to normal immediately.

Note that in the above-described embodiments, the output signal of the phase comparator 1 is forcibly made to be a special signal (low level signal) by the detection signal Va of the comparison signal presence/absence detector 5, or a special dummy pulse is inputted as the comparison signal to the phase comparator 1. However, the above-described embodiments are not limited to the same. For example, the control voltage Vc of the voltage control oscillator 3 may be controlled directly by the detection signal Va of the comparison signal presence/absence detector 5 such that the oscillation frequency of the voltage control oscillator 3 is controlled to a specific low frequency. No special accuracy is demanded of this specific low frequency at this time.

Further, in the above description, the operation stoppage state of the PLL circuit is judged by the presence/absence of an output signal of the frequency divider 4. However, the operation stoppage state of the PLL circuit may be judged by detecting whether or not the oscillation frequency fck of the voltage control oscillator 3 is a frequency of a predetermined value or more. In this case, the signal of the frequency fck may be converted into a voltage signal by a frequency/voltage converter, and this voltage signal compared with a predetermined value by a voltage comparator.

INDUSTRIAL APPLICABILITY

From the above, in accordance with the present invention, there is the advantage that, when an oscillation frequency of a voltage control oscillator exceeds a predetermined value and a PLL circuit stops operating, operation can return to normal quickly with a simple structure. The present invention is suitable for generation of a sampling clock of a wide range which is used when digitally processing analog image signals, and for the like.

What is claimed is:

1. A PLL circuit in which a phase comparator, a loop filter, a voltage control oscillator and a frequency divider are successively loop-connected, said PLL circuit comprising:

operation stoppage detecting means for detecting that PLL operation has stopped, said detection being effected on the basis of an output signal from only said voltage control oscillator or said frequency divider; and control means for, when said operation stoppage detecting means detects stoppage of operation, controlling the voltage control oscillator such that an oscillation frequency of the voltage control oscillator is low.

2. A PLL circuit according to claim 1, wherein said operation stoppage detecting means is a means for detecting presence/absence of an output signal of the frequency divider.

3. A PLL circuit according to claim 1, wherein said operation stoppage detecting means is a means for detecting whether or not an oscillation frequency of the voltage control oscillator is a value higher than a predetermined value.

4. A PLL circuit according to any one of claims 1, 2 or 3, wherein said control means is a means for switching an output of the phase comparator to a value at which an oscillation frequency of the voltage control oscillator decreases.

5. A PLL circuit in which a phase comparator, a loop filter, a voltage control oscillator and a frequency divider are successively loop-connected, said PLL circuit comprising:

operation stoppage detecting means for detecting that PLL operation has stopped, said detection being effected on the basis of an output signal from said voltage control oscillator or said frequency divider; and control means for, when said operation stoppage detecting means detects stoppage of operation, controlling the voltage control oscillator such that an oscillation frequency of the voltage control oscillator is low, wherein said control means is a means for switching a comparison signal inputted to the phase comparator such that an oscillation frequency of the voltage control oscillator decreases.

* * * * *